United States Patent [19]

Ameen et al.

[11] Patent Number: 4,803,100
[45] Date of Patent: Feb. 7, 1989

[54] SUSPENSION AND USE THEREOF

[75] Inventors: Joseph G. Ameen, Apalachin; Timothy F. Carden, Vestal; Lawrence R. Cutting, Owego; Stephen R. Engle; Ronald J. Moore, both of Binghamton, all of N.Y.

[73] Assignee: International Business Machines Corporation, Armonk, N.Y.

[21] Appl. No.: 110,892

[22] Filed: Oct. 21, 1987

[51] Int. Cl.$^4$ .................. B05D 3/02; C09K 5/00; H01B 3/20
[52] U.S. Cl. ........................ 427/387; 252/75; 252/573
[58] Field of Search ............... 427/387; 252/75, 573

[56] References Cited

U.S. PATENT DOCUMENTS

| | | | |
|---|---|---|---|
| 3,576,656 | 4/1971 | Webb | 106/296 |
| 3,660,087 | 5/1972 | Kaspaul et al. | 106/296 X |
| 3,687,723 | 8/1972 | Hutchins IV | 117/222 |
| 3,784,407 | 1/1974 | Shiio et al. | 252/512 X |
| 4,186,367 | 1/1980 | Chakrabarty et al. | 338/21 |
| 4,187,340 | 2/1980 | Oishi et al. | 428/210 |
| 4,265,775 | 5/1981 | Aakalu et al. | 252/573 |
| 4,563,544 | 1/1986 | Bui et al. | 174/140 C |
| 4,652,618 | 3/1987 | Sumida et al. | 525/478 |
| 4,699,802 | 10/1987 | Nakos et al. | 522/46 X |
| 4,720,518 | 1/1988 | Chihara et al. | 428/474.4 X |

Primary Examiner—Michael Lusignan
Attorney, Agent, or Firm—Pollock, Vande Sande & Priddy

[57] ABSTRACT

A suspension of a coating material having hydrogen bonds and pre-determined physical and chemical characteristics in a predominantly solid state in a polar solvent that is capable of breaking the hydrogen bonds and providing the material in a liquid form and use of the suspension to provide substantially uniform conformal layer of material onto a workpiece by applying the suspension to a workpiece and then evaporating the polar organic solvent so that the coating material is provided in its predominantly solid state having substantially the predetermined physicall and chemical characteristics.

12 Claims, 1 Drawing Sheet

SUSPENSION AND USE THEREOF

TECHNICAL FIELD

The present invention is concerned with suspensions of coating materials and especially coating materials that can be applied in relatively thin film layers that find particular use for enhancing the cooling ability of electrical components. In addition, the present invention is concerned with a method of coating a substantially uniform conformal layer of material onto a workpiece and particularly onto an electrical component such as an integrated circuit chip. The present invention is especially concerned with providing materials and process that find particular applicability as heat transfer materials for cooling of electronic components.

BACKGROUND ART

During use, many electrical components generate heat and for proper functioning of the electrical components, it is necessary to remove the heat from the component. Among the means of accomplishing this heat transfer have been suggested, especially for small electronic modules, such as those containing integrated circuit chips, thermally conductive greases or radial finger contacts that shunt the heat from the chip to the cap present to protect the chip.

Integrated circuit modules generally include a cap portion to protect the integrated circuit chip. A typical configuration of an integrated circuit module can be found, for example, in U.S. Pat. No. 4,233,620 to Darrow, et al. and assigned to the assignee of the present application, disclosure of which is incorporated herein by reference.

In order to facilitate removal of heat from the integrated circuit chip, a thermally conductive grease can be applied between the integrated circuit chip and the cap. The thermally conductive grease is usually in direct contact with the integrated circuit chip(s) and cap. Heat generated from the integrated circuit chip during use is conducted from the integrated circuit chip by the grease to the module cap; whereafter, it is dissipated into the ambient surroundings.

Thermally conductive greases for this purpose are well-known and typically they contain a liquid carrier and a thermal filler to increase heat conduction. In addition, other components for specific purposes such as to thicken the grease or remove moisture from the grease can be added.

An improved thixotropic, thermally conductive material is disclosed in U.S. Pat. No. 4,265,775 to Aakalu, et al., and assigned to the assignee of the present application, disclosure of which is incorporated herein by reference. The thermally conductive materials disclosed therein overcome a number of problems that occurred in prior greases. Although the thixotropic, thermally conductive material disclosed in U.S. Pat. No. 4,265,775 is quite suitable for its intended purpose, such material is very difficult to apply due to its viscosity and its inherent high adhesive and cohesive forces. In particular, these greases are normally squeegeed in relatively thick increases the assembly loads on the module and, in some instances, tends to cause damage to the chip when applied to the chip.

SUMMARY OF INVENTION

In accordance with the present invention, a composition is provided that can be dispensed in relatively thin layers and over irregular surfaces. Moreover, since the compositions of the present invention can be dispensed in relatively thin layers at the desired interfaces without excessive grease volume, such makes it possible to employ relatively thin layers, thus tending to prevent significantly higher assembly loads as experienced in the prior art. Furthermore, the present invention makes it possible to dispense the coating over irregular surfaces and without causing mechanical damage to the surfaces coated. Moreover, the present invention facilitates the application of the coating material without changing the chemical and physical characteristics of the basic composition that does not include the modifications that are the subject of the present invention.

In particular, the present invention is concerned with coating a substantially uniform, conformal layer of material onto a workpiece. The method of the present invention includes providing a suspension of a coating material in a polar organic solvent. The coating material has hydrogen bonds and predetermined physical and chemical characteristics in a predominantly solid state. The polar solvent is capable of breaking the hydrogen bonds and providing the material in liquid form. The suspension is applied to the workpiece to coat it uniformly and conformally. The polar organic solvent is evaporated so that the coating material is provided in its predominantly solid state having at least substantially the predetermined physical and chemical characteristics.

In addition, the present invention is concerned with a suspension of a material that has hydrogen bonds and predetermined physical and chemical characteristics in a predominantly solid state suspended in a polar organic solvent that is capable of breaking the hydrogen bonds and liquefying the material and also capable of permitting the material, upon evaporation of the polar solvent, to have substantially the same physical and chemical characteristics had the material not been suspended in the polar organic solvent.

BEST AND VARIOUS MODES FOR CARRYING OUT INVENTION

Figure 1:
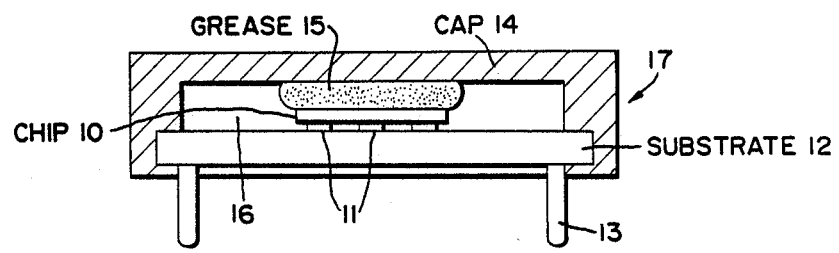
FIG. 1 illustrates systems of electronic components.

It has been found in accordance with the present invention that the addition of a polar organic solvent to a material having hydrogen bonds and predetermined physical and chemical characteristics in a predominantly solid state will result in breaking down the hydrogen bonds and in liquefying the composition to facilitate coating onto a workpiece. Predominantly solid state refers to the material in a paste-like or grease-like condition having relatively high solids packing fraction. After the polar organic solvent is evaporated, the original structure of the material including its physical and chemical characteristics are obtained. The preferred polar organic solvents employed pursuant to the present invention are chlorinated hydrocarbons, examples of which are methyl chloroform (1,1,1,-trichloroethane) and methylene chloride. In the preferred aspects of the present invention, the solvent dissolves the liquid organo-silicone carrier of the grease.

The coating material employed in accordance with the present invention is preferably a thixotropic, thermally conductive material such as a thermally conductive grease of the type disclosed in U.S. Pat. No.

4,265,775, disclosure of which is incorporated herein by reference. In particular, the thixotropic, thermally conductive material includes a liquid organo-silicone carrier, substantially spherical silica in an amount effective to prevent bleeding of the liquid carrier and a thermal filler powder.

The liquid organo-silicone carrier should be resistant to drying out over extended periods of time, retain the thermal filler powder and the silica particles without separation, and be chemically inert. Generally, the liquid organo-silicone compound has a viscosity of from about 10 centistokes to about 50,000 centistokes at about 25° C. and more usually the liquid organo-silicone compound has a viscosity of from about 20 centistokes to about 1,000 centistokes at 25° C.

Examples of some specific liquid organo-silicone compounds suitable for the present invention are the liquid organo-polysiloxanes represented by the following formula:

$$R_n SiO_{4-n/2}$$

wherein R represents an alkyl radical having up to 22 carbon atoms, a cycloalkyl radical having 5 to 7 carbon atoms in the ring, mononuclear and bi-nuclear aryl radicals, mononuclear aryl lower alkyl radicals, cyano lower alkyl radicals, and lower alkenyl radicals having from about 2 to about 8 carbon atoms; and n has a value of from 2 to 3. Such organo-polysiloxanes are described in U.S. Pat. No. 3,882,033 to Wright, disclosure of which is incorporated herein by reference.

A specific example of a liquid organo-silicone material employed in the present invention is a polydimethylsiloxane having a viscosity of about 100 centistokes at 25° C. and being commercially available from Dow Corning under the trade designation DC200.

In addition, if desired, a conventional wetting agent can be used to increase the amount of thermal filler powder. The wetting agent can be selected from those conventionally known in the art.

For example, conventional anionic, cationic, or non-ionic wetting agents can be used, typical examples of which include Tergitol NR27 (non-ionic), Tergitol NR7 (anionic), and Triton X-100 (cationic) wetting agents. When employed, the amount of wetting agent is usually less than about 5 volume percent of the coating material. The use of the wetting agent or surfaceactive agent also facilitates mixing of the components of the coating material.

The preferred thermal greases employed pursuant to the present invention also include silica fibers, the majority of which are usually about 0.01 micron in size and substantially all of which are less than 0.5 microns in size. The fibers tend to be rather spherical in shape in view of their extremely small particle size.

In preparation of the coating material, it is preferred that the silica fibers be added to the liquid organosilicone material prior to the addition of the thermal filler powder. The silica fibers employed are highly porous, less than about a 0.5 micron diameter, and generally at least about 80 volume percent thereof are smaller than 0.1 micron. The average diameter of the silica fibers generally is less than about 0.1 micron and most preferably about 0.01. The use of the silica fibers as disclosed in U.S. Pat. No. 4,265,775 substantially eliminates bleeding or loss of the liquid organo-silicone carrier from the thermally conductive grease.

The thermal grease also includes a thermal filler powder. The preferred thermal filler powder is zinc oxide, which most preferably can be dendritic or generally elongated spheres. Of course, mixtures of the thermal filler powders can be employed if desired. Also, other known thermal filler materials can be employed, if desired.

With respect to the size of the thermal filler powder, generally decreasing the size increases the thermal conductivity without any harm to the other characteristics of the thermally conductive grease. When zinc oxide is employed, usually the zinc oxide has a submicron size with about 99% of all the particles having an average diameter of about 0.5 microns or less.

The thermally conductive coating material generally contains about 15% by volume to about 60% by volume and preferably about 50% by volume to about 60% by volume of the thermal filler powder, from about 0.1% to about 4% by volume of the silica material with the balance being the liquid organo-silicone carrier.

The amount of polar organic solvent employed is usually about 80% to about 40% by weight of the total of the polar organic solvent and the coating material and preferably about 50% by weight of the total of the polar organic solvent and coating material.

According to the preferred aspects of the present invention, the polar organic solvent is added to the coating material after all of the constituents of the coating material have been mixed together to provide the desired coating material in its predominantly solid state. The polar organic solvent can be added to the coating material under ambient conditions of temperature and pressure and agitated vigorously.

The preferred thermal greases of the present invention are preferably prepared as disclosed in U.S. Pat. No. 4,265,775 by adding the silica fibers to the liquid organo-silicone material and then adding the thermal filler powder to thereby produce formulations exhibiting the lowest degree of bleeding. However, this sequence is not entirely necessary and the various components of the thermally conductive grease can be mixed in any order desired. Likewise, the polar organic solvent and the other components of the coating material can be mixed in any order desired.

The mixing can be conducted using any conventional mixing means which does not, of course, destroy the character of the silica fibers or the thermal filler powder. A typical mixing means which can be utilized is a three-roll mill.

The suspensions of the present invention are more easily applied to the workpiece than the thermally conductive greases from which the suspensions are derived. Accordingly, the film thicknesses applied can be better controlled and can be significantly thinner than those obtained from the thermally conductive greases, per se. For instance, typical film thicknesses obtained from the suspensions of the present invention are about 0.5 mil to about 100 mils. An average thickness for the normal greases is about 12 to about 15 mils. The compositions can be applied by any conventional means such as dipping, casting, spraying, or dispensing such as from a dispensing needle.

After applying the composition to the workpiece, the polar organic solvent will evaporate. Normally, the evaporation is carried out under ambient conditions. However, in the event the solvent employed is methyl chloroform, elevated temperatures up to about 65° C. can be employed to facilitate removal of the methyl chloroform. When the polar solvent employed is methylene chloride, elevated temperatures of up to about 35° C. can be employed to facilitate evaporation thereof.

After evaporation of the polar solvents, the coating material returns to its predominantly solid state whereby it has the same predetermined physical and chemical characteristics as it would had not the polar organic solvent been present. This is surprising since normally when a material is dissolved in a solvent and the solvent is evaporated, the original structure of the material is not obtained.

The thermally conductive greases are particularly useful for heat transfer applications with electronic components such as in systems as illustrated in FIG. 1 wherein reference (17) denotes the module, reference (10) denotes a conventional IC chip, reference (11) denotes metal contacts putting chip (10) into contact with substrate (12), provided with conductor pins (13). Cap (14) is placed over substrate (12) and IC chip (10), the thermally conductive grease (15) being interposed between chip (10) and cap (14) in intimate contact therewith.

In addition, rather than being merely interposed between chip (10) and cap (14), the thermally conductive grease can be utilized to completely fill space (16) and module (17).

While the coating materials of the present invention have been described as finding particular application in cooling components, it should be understood that its use is not so limited. In fact, the coating materials find general application wherever good heat transfer is required.

The following non-limiting examples are presented to further illustrate the present invention.

EXAMPLE 1

About 225.4 grams of polydimethylsiloxane are placed into an appropriate container. The polydimethylsiloxane is a reagent grade available from Dow Corning under the trade designation DC200 and has a specific gravity of about 0.97 at 25° C., a dielectric constant of 2.5 KHz, a dielectric strength of 350 volts per milliliter, and a viscosity of 100 centistokes at 25° C.

About 4.6 grams of silica fiber, available under the trade designation M-5 Cab-O-Sil having a size of less than 0.5 microns, the majority of which is less than about 0.1 micron, with an average diameter of about 0.01, are then mixed together at room temperature and well-mixed therein. After thorough mixing, about 1160 grams of zinc oxide powder are mixed to provide a uniform thermally conductive grease.

To the grease is admixed methyl chloroform in an amount of about 50% by weight based upon the total weight of the grease and the methyl chloroform to liquify the grease and provide a colloidal suspension thereof. The colloidal suspension is then applied to an integrated circuit module by dispensing from a dispensing needle and the methyl chloroform is evaporated. A film thickness of about 4 mils is formed. The physical and chemical characteristics of the film are the same as the physical and chemical characteristics of a film obtained from the grease without the methyl chloroform.

EXAMPLE 2

The procedure of Example 1 is repeated, except that the solvent employed is methylene chloride. The results obtained are similar to those from Example 1.

While the present invention has been described in detail and with reference to specific embodiments thereof, it would be apparent to those skilled in the art that various changes and modifications can be made therein without departing from the spirit and scope thereof.

Having thus described our invention, what we claim as new and desire to secure by Letters Patent is:

1. A method of coating a substantially uniform conformal layer of material onto a workpiece which comprises:
    (a) providing a suspension of a coating material wherein said coating material has hydrogen bonds and predetermined physical and chemical characteristics in a predominantly solid state in a polar organic solvent which polar solvent is capable of breaking said hydrogen bonds and providing said material in liquid form;
    (b) applying said suspension to a workpiece to coat said workpiece conformally; and
    (c) evaporating said polar organic solvent so that said material is provided in its predominantly solid state having at least substantially said predetermined physical and chemical characteristics.

2. The method of coating in accordance with claim 1 wherein said coating material comprises a silicone polymer.

3. The method of coating in accordance with claim 2 wherein said polar solvent is a chlorinated hydrocarbon.

4. The method of coating in accordance with claim 1 wherein said material is applied to said workpiece by spraying.

5. The method of coating in accordance with claim 1 wherein said material is applied to said workpiece by liquid application.

6. The method of coating in accordance with claim 1 wherein one of said physical characteristics is thermal conductivity.

7. The method of claim 1 wherein said polar solvent is added to said material until liquefaction occurs and upon evaporation of said polar solvent, said material returns to its original predominantly solid state having substantially said predetermined physical and chemical characteristics.

8. The method of claim 1 wherein said polar organic solvent is methyl chloroform or methylene chloride.

9. The method of claim 1 wherein said coating material is a thixotropic thermally conductive material comprising a liquid organo-silicone carrier, substantially spherical silica in an amount effective to prevent bleeding of said liquid carrier, substantially all of said silica being less than 0.5 microns in size, and thermal filler powder.

10. The method of claim 9 wherein said thermal filler powder is zinc oxide.

11. The method of claim 9 which comprises from about 15% by volume to about 60% by volume of said thermal filler powder, from about 0.1% to about 4% by volume of said silica, balance by volume of said organo-silicone liquid carrier.

12. The method of claim 11 which comprises from about 50% to about 60% by volume of said thermal filler powder.

* * * * *